United States Patent [19]
Omura

[11] Patent Number: 5,660,883
[45] Date of Patent: Aug. 26, 1997

[54] PROCESS FOR CATALYZATION IN ELECTROLESS PLATING

[75] Inventor: Yoshihiko Omura, Tottori, Japan

[73] Assignees: Omura Toryo Co., Ltd., Tottori Prefecture; Daishin Chemical Co., Ltd., Tokyo, both of Japan

[21] Appl. No.: 404,155

[22] Filed: Mar. 14, 1995

[30] Foreign Application Priority Data

Dec. 8, 1994 [JP] Japan .................................. 6-331097

[51] Int. Cl.⁶ .................................................. B05D 3/04
[52] U.S. Cl. ........................ 427/304; 427/437; 427/443.1
[58] Field of Search ................................... 427/304, 437, 427/443.1

[56] References Cited

U.S. PATENT DOCUMENTS

| | | | |
|---|---|---|---|
| 4,663,240 | 5/1987 | Hajdu et al. | 428/545 |
| 4,670,306 | 6/1987 | Salem | 427/258 |
| 5,336,415 | 8/1994 | Neans | 210/725 |
| 5,475,080 | 12/1995 | Gruber et al. | 528/354 |
| 5,492,676 | 2/1996 | Price et al. | 424/417 |

*Primary Examiner*—Benjamin Utech
*Attorney, Agent, or Firm*—Wenderoth, Lind & Ponack

[57] ABSTRACT

There is disclosed a novel process for catalyzation for trapping of a catalyst metal involved with the adhesion of an electroless plating to a substrate. The process is carried out by employing neither the sensitizing-activating method nor the catalyst-accelerator method. Specifically, in forming an electroless plating on the surface of a non-conductive substance as a substrate, the surface of the non-conductive substance is coated with a treatment liquid containing at least chitosan or a chitosan derivative before the steps of catalyzation and electroless plating to form a hydrophilic coating film on the surface of the non-conductive substance.

7 Claims, 5 Drawing Sheets

PROCESS FOR CATALYZATION IN ELECTROLESS PLATING

BACKGROUND OF THE INVENTION

1. Field of the Invention

The present invention relates to a process for trapping a catalyst metal strongly involved with the adhesion of a metallic deposit, or electroless plating, to a substrate in an electroless plating process. Specifically, the present invention relates to a process for trapping and fixing a catalyst metal as catalytic nuclei on the surface of a substrate through selective and strong chemisorption of the catalyst metal from a solution containing the catalyst metal by the action of chitosan or a chitosan derivative contained in a pretreatment agent.

2. Description of the Prior Art

Non-conductive plastics, ceramics, paper, glass, fibers, etc. can be plated by electroless plating. In order to initiate oxidation of a reducing agent in a plating solution, however, the surface of such a non-conductive substance as mentioned above must be subjected to a catalyzation treatment. Although a known classical catalyzation treatment method is a sensitizing-activating method wherein are employed a stannous chloride bath and a palladium chloride bath, a catalyst-accelerator method wherein are employed a stannous chloride-palladium chloride bath and a sulfuric acid (or hydrochloric acid) bath is now generally employed as a catalyzation treatment method. Further, another catalyzation treatment method has recently begun to be adopted, wherein a substrate is immersed in a solution of a palladium complex having a strong adsorbability and then washed with water, followed by precipitation of palladium metal with a reducing agent such as dimethylaminoborane.

Figure 1:
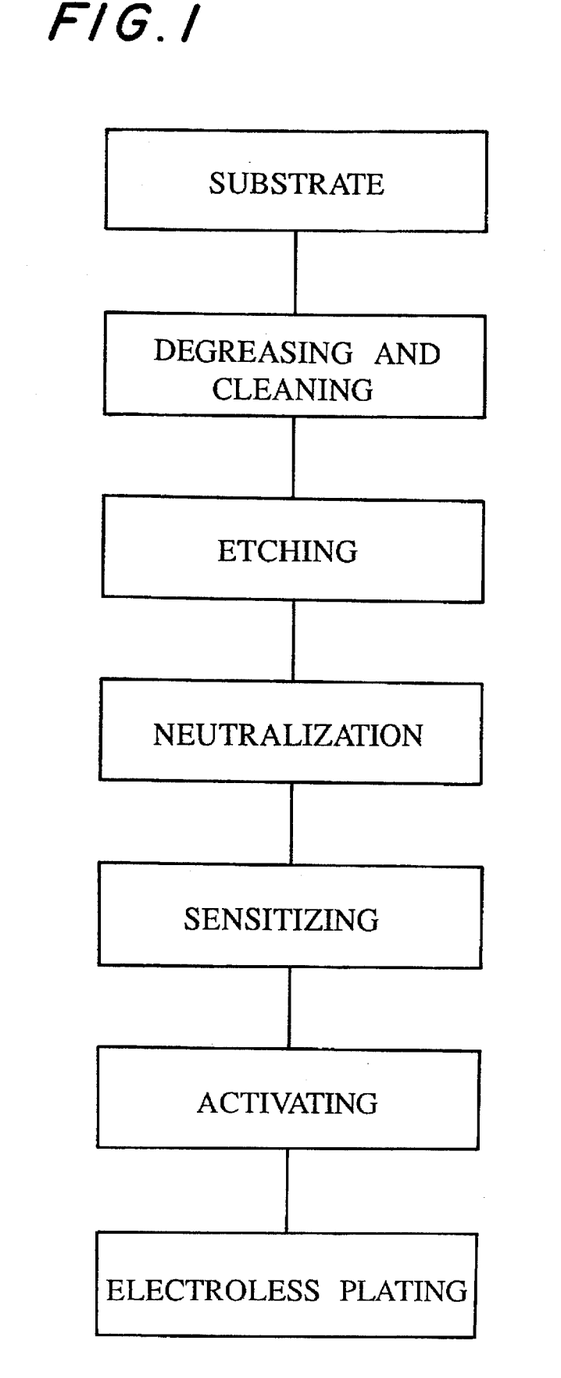
FIG. 1 is a flow chart of a conventional electroless plating process comprising catalyzation according to the sensitizing-activating method.
Figure 2:
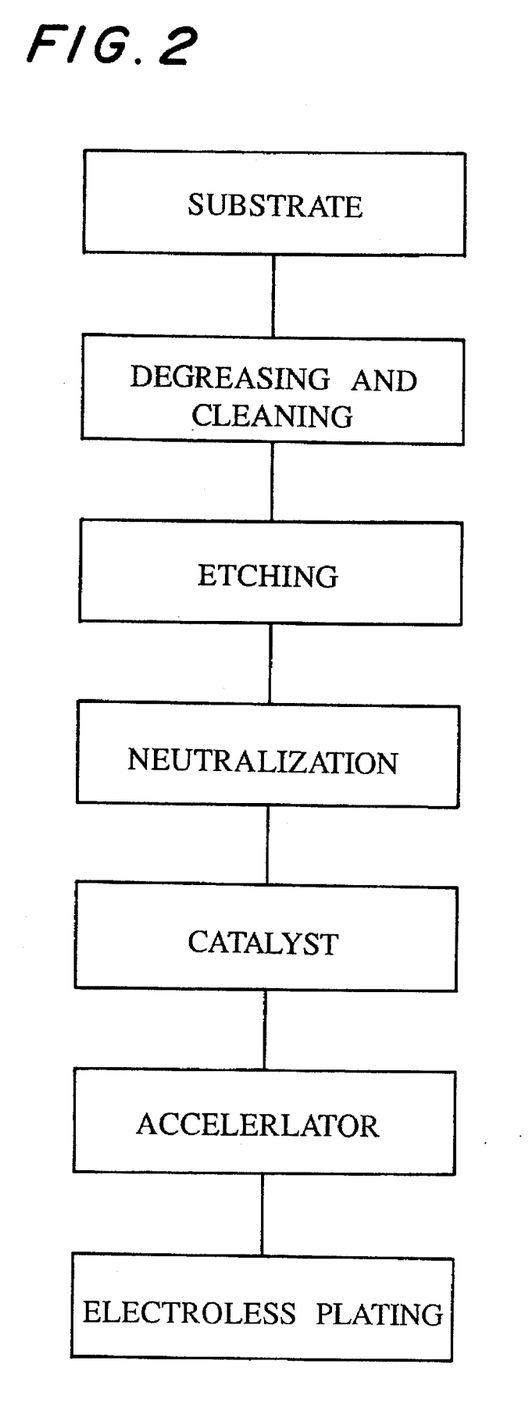
FIG. 2 is a flow chart of a conventional electroless plating process comprising catalyzation according to the catalyst-accelerator method.

The step of pretreatment useful for the step of catalyzation is an etching step required in order to secure a wettability (hydrophilicity) of the surface of a substrate for promoting the physical adsorption thereon of a catalyst metal. In such an etching step, a chromic acid etching solution is now used for plastics and the like in most cases. In the chemical etching step, the surface of a substrate is microscopically roughened to facilitate physical trapping thereby of a catalyst metal in the catalyzation step while securing an anchoring effect involved with the adhesion of the resulting metallic deposit, or plating, to the substrate. In this sense, the chemical etching step is a very important step (see FIGS. 1 and 2).

According to the sensitizing-activating method, which is a two-stage process, a substrate is first immersed in a solution of stannous chloride in the sensitizing step thereof to adsorb $Sn^{2+}$ on the surface of the substrate, and then treated with a solution of palladium chloride in the activating step thereof to precipitate Pd nuclei according to a redox reaction represented by the following formula:

Chemicals to be used in sensitizing, i.e., sensitizers, have heretofore been studied since old days including those as disclosed in patents dating from around 1936 (U.S. Pat. No. 2,063,034 (Dec. 8, 1936). The kind of sensitizer is not so often varied depending on the kind of substrate and the kind of electroless plating. A variety of hydrochloric acid-acidified solutions of stannous chloride used solely as a principal ingredient are used in the sensitizing step. Proposed sensitizers other than stannous chloride include platinum chloride and titanium chloride, which may also be used in the form of a hydrochloric acid-acidified solution. On the other hand, a solution of palladium chloride (0.2 to 1 g/l, hydrochloric acid: 5 ml/l) is most widely used as the activating solution. Salts of precious metals such as Pt, Au and Ag other than Pd are also effective for an electroless copper plating solution.

The catalyst to be used in the catalyst-accelerator method is a mixed solution of stannous chloride and palladium chloride with hydrochloric acid, which is commercially available in the form of a concentrated solution, which is usually diluted with a large amount of a solution of hydrochloric acid to be ready for use thereof. The catalyst-accelerator method is carried out at a treatment temperature of 30° to 40° C. for an immersion time of 1 to 3 minutes. 5 to 10 vol. % sulfuric acid or hydrochloric acid is generally used as the accelerator, which may alternatively be a solution of sodium hydroxide or ammonia. Rantell et al. reported that the mixed solution of stannous chloride and palladium chloride with hydrochloric acid is not colloidal, but a solution of a complex salt having a composition: $SnPd_7Cl_{16}$ and solubilized in the presence of surplus stannous chloride. Further, Rantell et al. drew the following inference as to the progress of a reaction in the accelerator step [A. Rantell, A. Holtzman; Plating, 61, 326 (1974)].

In the catalyst step, the $Sn^{2+}$–$Pd^{2+}$ complex salt is first adsorbed on the surface of a substrate, and the adsorbed complex salt is then hydrolyzed when the substrate is washed with water. Through the hydrolysis, tin is precipitated in the form of an Sn(OH)Cl precipitate, which is in a state of coexisting with tetravalent tin and the palladium salt. In the following accelerator step, the precipitated stannous salt is dissolved and then reacted with the palladium salt already relieved of a complex salt state to yield palladium metal according to the following redox reaction:

As a result, palladium metal and small amounts of bivalent and tetravalent tin salts remain on the surface of the substrate.

The reaction mechanisms involved in the sensitizing-activating method and the catalyst-accelerator method as the conventional catalyzation methods for electroless plating have been substantially elucidated as described hereinbefore. In any case, however, many reactions are involved until catalytic nuclei of a metal such as palladium are precipitated. Accordingly, the catalyst metal is lost little by little in the form of various reaction intermediates formed by the respective reactions every time when washing of a substrate with water, and the like are effected for every such reaction. The final residue of the catalyst metal is greatly affected by many factors such as the concentrations, pH values and temperatures of solutions used in respective steps, and the immersion periods of time for such solutions, as well as the conditions of degreasing and roughening of the surface of the substrate. Accordingly, when the final uptake of the catalyst metal is insufficient, the adhesion of the resulting metallic deposit to the substrate is always imperfect to cause a failure in plating.

The foregoing phenomena are attributed to mere "physical adsorption" of such catalyzation reaction intermediates and the metal catalyst trapped into recesses and micropores in the surface portion of the substrate microscopically roughened by chemical etching.

SUMMARY OF THE INVENTION

An object of the present invention is to provide an entirely novel process capable of realizing a stronger adsorptive bond of a catalyst onto the surface of a substrate to attain a great improvement in the adhesion of a metallic deposit, or plating, to the substrate by adopting neither the sensitizing-activating method nor the catalyst-accelerator method.

Specifically, in accordance with the present invention, there is provided a process for catalyzation in electroless plating: comprising forming a coating film comprising chitosan or a chitosan derivative on the surface of a non-conductive substance, and subsequently treating the coating film with a solution of a salt of a catalyst metal to effect chemisorption thereof on the coating film. According to the present invention, the strong chemisorption of the catalyst metal on the coating film comprising chitosan or the chitosan derivative enables electroless plating to be smoothly effected on the surface of the non-conductive substance.

Chitosan ($\beta$-1,4-poly-D-glucosamine) that may be used in the present invention is obtained by deacetylation of chitin ($\beta$-1,4-poly-N-acetyl-glucosamine) extracted as a natural polymer from crusts and the like of crabs and the like. Chitosan is a cationic biopolymer having amino groups, and a new material having useful characteristics such as a moisture retention, antifungal properties and a heavy metal absorptivity. Chitosan has a biological adaptability like chitin, and application thereof to the pharmaceutical and biochemical fields such as artificial skin is therefore under active study. The present invention has been completed with attention paid to a metal absorptivity of chitosan, particularly a specific absorptivity of chitosan for precious metals such as palladium, platinum and rhodium. Besides chitosan, chitosan derivatives such as carboxymethylchitosan and glycol chitosans can also be used. The degree of deacetylation of chitosan or the chitosan derivative to be used in the present invention is desirably at least 80%, preferably at least 90%. When chitosan is used, having a degree of deacetylation lower than 80%, the adsorptivity thereof for a catalyst metal such as palladium, the hydrophilicity of the coating film, etc. may possibly be adversely affected.

Examples of the non-conductive substance to be used as a substrate in the present invention include plastics, ceramics, paper, glass, and fibers, which cannot be directly plated by electroplating.

Figure 3:
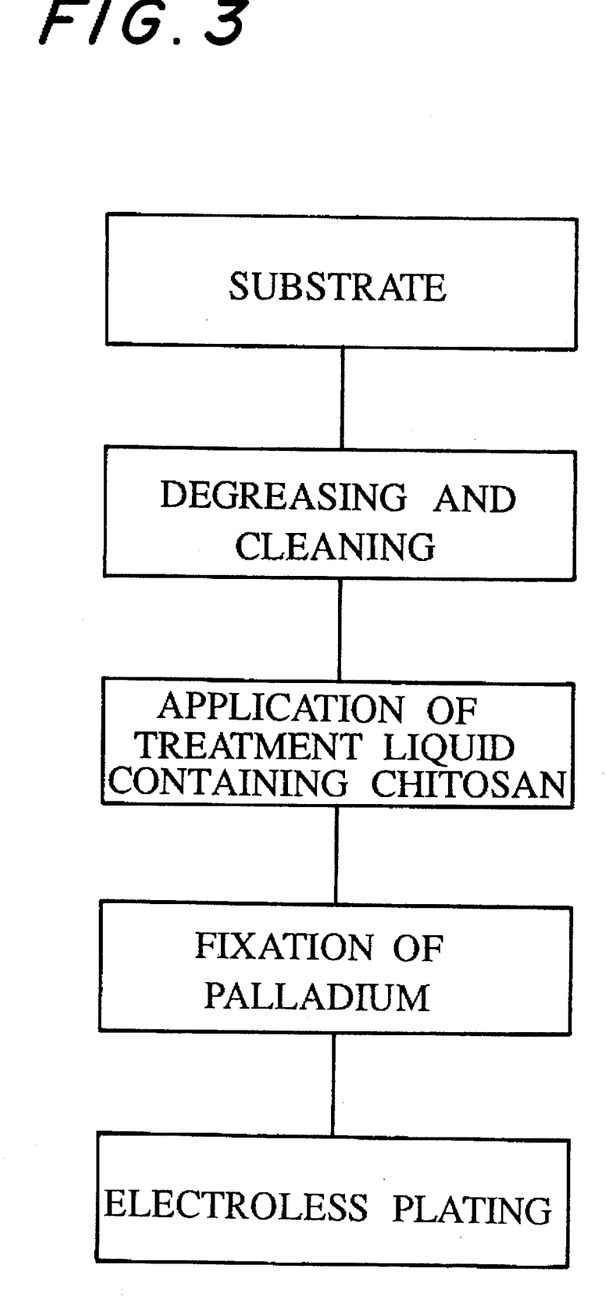
FIG. 3 is a flow chart of an electroless plating process wherein catalyzation is performed through the formation of a catalyst metal-fixing carrier containing chitosan according to the present invention.

In forming an electroless plating on the surface of the non-conductive substance, according to the process of the present invention, the surface of the non-conductive substance is coated with a treatment liquid containing at least chitosan or the chitosan derivative (hereinafter referred to simply as "chitosan") to form a hydrophilic coating film on the surface of the non-conductive substance before the steps of catalyzation and electroless plating. In the hydrophilic coating film thus formed, chitosan chemically adsorbs, traps, and fixes a catalyst metal such as palladium. In the electroless plating step, there can consequently be secured such a state that a sufficient amount of an active catalyst is borne on the surface of the substrate, on which the electroless plating having a good adhesion to the substrate can be uniformly and efficiently formed (FIG. 3).

The chitosan concentration of the treatment liquid containing chitosan is desirably in the range of 0.01 to 1%, preferably in the range of 0.05 to 0.2%. When it is decreased lower than 0.01%, the effect of the concentration of adding chitosan is so lowered as to fail to obtain an effective trapping of the catalyst. On the other hand, when it exceeds 1%, the effect of adding Chitosan is so saturated as to lower the coating effect by the treatment liquid.

In addition to chitosan, the treatment liquid containing chitosan may contain a dilute acid such as acetic acid, formic acid or hydrochloric acid. The dilute acid may be used to dissolve chitosan in the treatment liquid. The concentration of the dilute acid is calculated in terms of equivalence to the free amino groups of chitosan to be used. Further, the treatment liquid may sometimes be admixed with a resin excellent in adhesion to the substrate, though it depends on the kind of substrate. Any resin can be used in so far as it is well compatible or miscible with chitosan. Examples of the resin that may be added to the treatment liquid include water-soluble resins such as polyvinyl alcohol and hydroxyethyl-cellulose; water-solubilized resins of an alkyd, polyester, acrylic, epoxy or like resin; and emulsions of a vinyl acetate, acrylic or like resin. Chitosan itself may be crosslinked with polyethylene glycol diglycidyl ether or the like to make the coating film so stable that the catalyzation reaction can be amplified. Further, a variety of inorganic pigment may sometimes be added to the treatment liquid in order to provide a more secure adhesion to the resulting electroless plating. Specifically, in this case, the surface of the coating film formed by application of the treatment liquid is microscopically uneven to provide such an anchoring effect during the course of electroless plating formation as to further contribute to an improvement in the adhesion thereof to the electroless plating, thus providing as an alternative of the chemical etching step in the conventional processes. Usable examples of the inorganic pigment include aluminum silicate, titanium oxide, and barium sulfate. The amount of the inorganic pigment may be 10 to 85%, preferably 50 to 70%, based on the solid content. When it exceeds 85%, the adhesion of the chitosan-containing treatment to the substrate is lowered in itself. Almost all of the balance is water and an organic solvent such as methanol, ethanol, isopropanol, and/or ethyl acetate. Such a solvent is effective in improving the compatibility of different resins in the case of addition thereof, somewhat eroding the substrate and quickening drying of the treatment liquid after application thereof. In addition when it is necessary, a hydrophilic surface-controlling agent may be added to the treatment liquid to impart appropriate degrees of leveling and hydrophilicity to the coating film formed therefrom. Examples of the surface-controlling agent include perfluoroalkyl ethylene oxides. The surface-controlling agent may be added in an amount of 0.05 to 1%, preferably 0.1 to 0.5%, based on the solid chitosan content.

The foregoing treatment liquid containing chitosan can be applied on the surface of the substrate by a conventional application method such as spray coating, roll coating, brushing, or dip coating to form a coating film which can serve as a hydrophilic carrier for fixation of the catalyst metal.

After formation of the catalyst metal-fixing carrier on the surface of the substrate, the step of fixing the catalyst metal through the catalyzation reaction is taken, followed by the step of electroless plating. Thus, the electroless plating having a good adhesion to the substrate can be efficiently formed. Furthermore, according to the present invention, only part of the surface of the non-conductive substance as the substrate can be pretreated with the treatment liquid containing chitosan. In this case, the catalyst can be selectively borne only on the pretreated portion(s) of the surface of the substrate, thus enabling partial electroless plating to be effectively effected in the following step. Moreover, according to the present invention, polyester resins such as polyethylene terephthalate, engineering plastics, various alloys, etc., which have heretofore been difficult to electrolessly plate, can be electrolessly plated satisfactorily.

Additionally stated, although the treatment liquid containing chitosan is applied directly on the surface of the non-conductive substance as the substrate in the foregoing procedure, an undercoating may be applied on the surface of the substrate before application thereon of the treatment liquid in some cases, where any undercoating having the best adhesion to the substrate can be used without consideration given to the compatibility thereof with chitosan as mentioned above, though the number of steps is increased. Examples of the undercoating include acrylic lacquers, acrylic coatings, and urethanated acrylic coatings having an excellent adhesion to plastics such as acrylic resins, ABS, polystyrene, polycarbonates, polypropylene, and polyesters.

Figure 4:
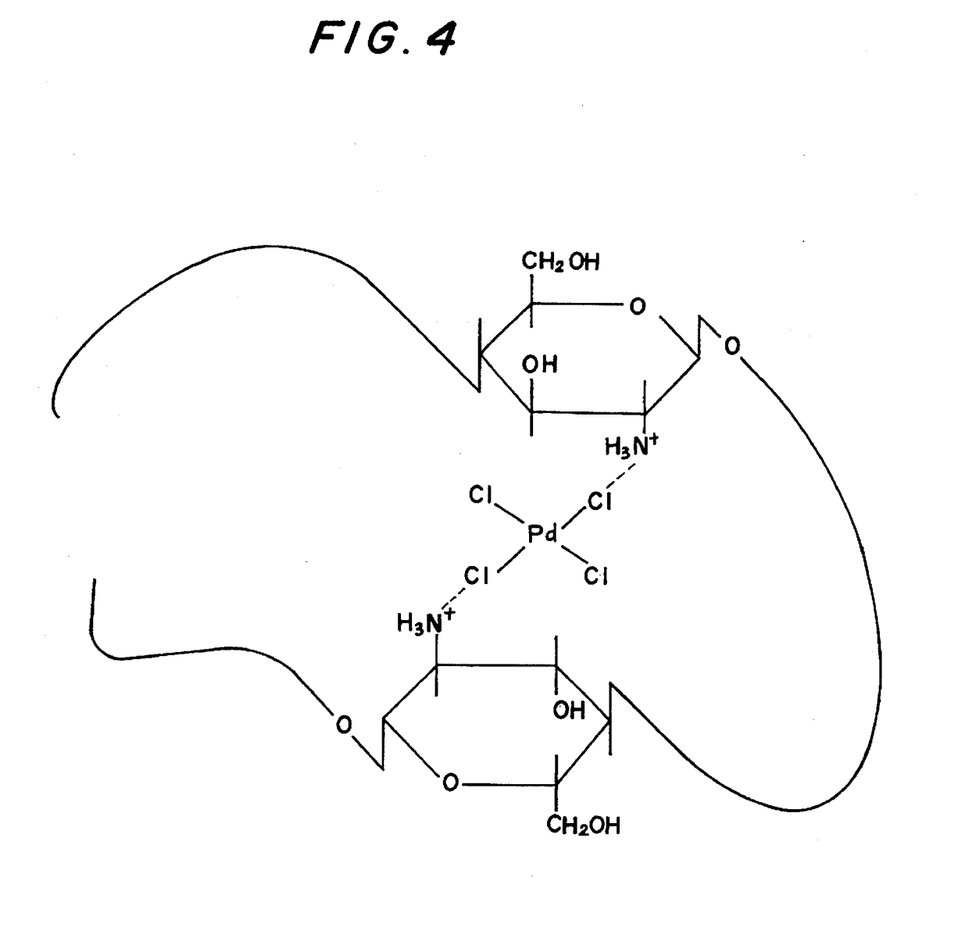
FIG. 4 is an illustration showing the mechanism of adsorption of palladium by the action of chitosan.
Figure 5:
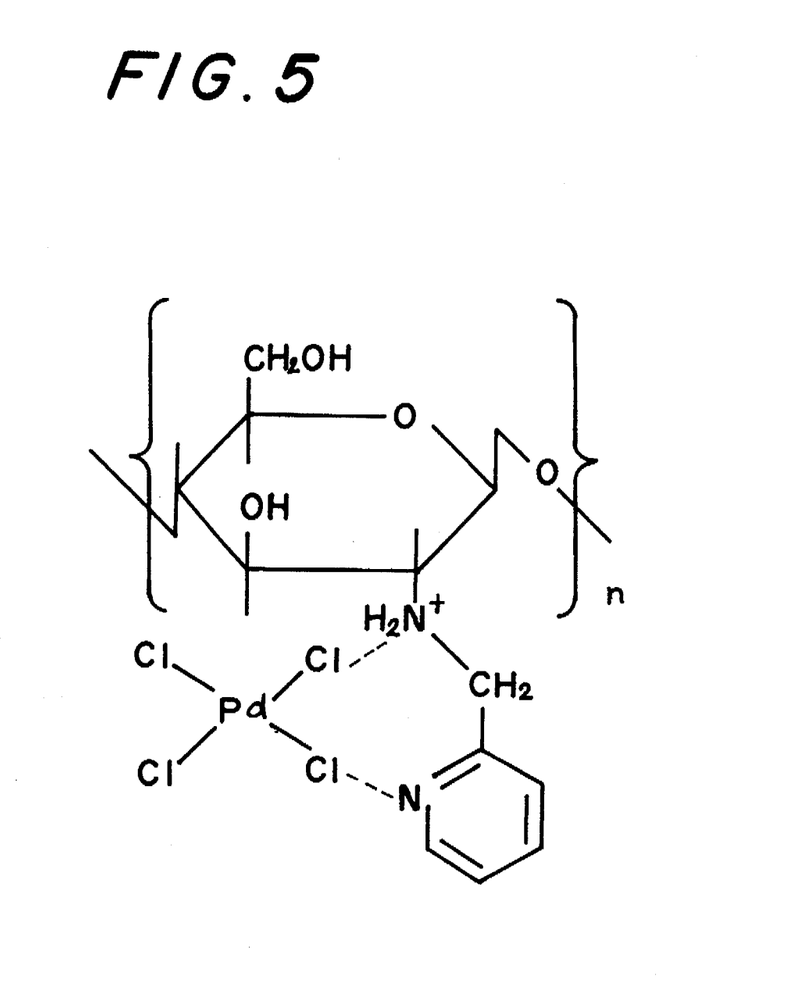
FIG. 5 is an illustration showing the mechanism of adsorption of palladium by the action of a chitosan derivative.

In the catalyzation reaction step, the substrate having the coating film formed as the catalyst metal-fixing carrier containing chitosan on the surface thereof is simply immersed in a hydrochloric acid-, nitric acid- or acetic acid-acidified solution of hydrochloride, nitrate or acetate of a precious metal such as Pd, Pt, Au or Ag, or the like for a short period of time to complete fixation of catalyst nuclei only in one stage different from conventional aforementioned sensitizing-activating method or catalyst-accelerator method. The representative precious metal salt is palladium chloride, which can be used in the form of a solution (palladium chloride: 0.2 to 1 g/l, hydrochloric acid: 5 ml/l) like an activating solution as used in the sensitizing-activating method. The chemisorption of palladium on the catalyst metal-fixing carrier containing chitosan is believed to be due to coordination bonds as illustrated in FIG. 4 [Baba et al.; Bull. Chem. Soc. Jpn., 66, 2915 (1993)]. The chemisorption can prevent palladium from falling off the carrier in the following electroless plating step. Additionally stated, the free amino groups of chitosan may be reacted with an aldehyde such as formaldehyde, salicylaldehyde, glutaraldehyde, pyridine-2-aldehyde, thiophene-2-aldehyde, or 3-(methylthio)propionaldehyde to form a Schiff base, which may then be reduced with sodium boron tetrahydride or the like to form a catalyst metal-fixing carrier on which the catalyst metal can be more selectively and more strongly borne, though it depends on the kind of catalyst metal (see FIG. 5).

Subsequently, the substrate having the foregoing catalyst metal-fixing carrier containing chitosan and having the catalyst metal borne thereon is immersed in a electroless plating bath of Cu, Ni, Co, Pd, Au or an alloy thereof, whereupon the electroless plating having an excellent adhesion to the substrate can be continuously and efficiently obtained, by the reducing action of the fixed catalyst nuclei, only on the portion(s) of the surface of the substrate where the catalyst metal-fixing carrier exists. Thus, the non-conductive substance can be metallized in accordance with the purpose.

According to the sensitizing-activating method, the catalyst-accelerator method, etc. as the catalyzation methods of the conventional electroless plating processes, a catalyst metal is borne on the surface of a substrate microscopically roughened by chemical etching through multiple stages of reactions effected on the surface of the substrate and by means of physical adsorption of the reaction product on the surface of the substrate, with the result that the residue of the catalyst metal is so unstable as to bring about adverse effects such as a failure in adhesion during the course of formation of the plating in many cakes. On the contrary, according to the catalyzation process of the present invention, a treatment liquid containing chitosan in the form of a coating is applied on the surface of a substrate to form a kind of catalyst metal-fixing carrier, on which a catalyst metal is strongly borne by chemisorption thereof, thus enabling a uniform metallic deposit good in adhesion to the substrate to be formed by electroless plating. Further, the catalyst is borne only on the pretreated portion(s) of the surface of the substrate whereon the treatment liquid is applied, thus the partial electorless plating may be obtained. Furthermore, chemical etching can be dispensed with to decrease the number of steps and to simplify the waste water treatment, greatly contributing to an improvement in environmental problems.

DETAILED DESCRIPTION OF THE PREFERRED EMBODIMENTS

EXAMPLE 1

Chitosan (SK-10 manufactured by San-Ei Chemical Industries, Ltd.) was dissolved in a 1% solution of acetic acid to prepare a 1 W/V % solution of chitosan, which was then diluted with methanol to prepare a pretreatment liquid containing 0.5% of chitosan. The pretreatment liquid was applied on Japanese paper (300 mm-square paper made of paper mulberry and manufactured by Dai-Inshu Seishi Kyogyo Kumiai) while using a spray or a brush, and then force-dried at 50° C. for 1 hour.

Subsequently, the coated paper was immersed in a solution of palladium chloride ($PdCl_2.2H_2O$: 0.3 g/l, hydrochloric acid: 5 ml/l) for 30 minutes, then washed with water, and then subjected on trial to electroless copper plating in a plating bath having a composition as shown in Table 1.

TABLE 1

| Ingredient | Concentration |
| --- | --- |
| copper sulfate | 0.12 mol/l |
| EDTA | 0.12 mol/l |
| 2,2-pyridyl | 10 mg/l |
| potassium ferrocyanide | 10~20 mg/l |
| formalin | 0.5 mol/l | pH 12.5, liquid temperature: 60° C. agitation with air.

As a result, a uniform copper deposit could be obtained on the whole surface of the Japanese paper in the case of applying the pretreatment solution on the whole surface of the paper and only on part of the surface of the Japanese paper in the case of applying the pretreatment solution partly on the surface of the paper.

EXAMPLE 2

Chitosan (SK-100, Lot. 414-05; manufactured by San-Ei Chemical Industries, Ltd.) was dissolved in a 1% solution of acetic acid to prepare a 1 W/V % solution of chitosan, which was then admixed with 1 V/V % of a solution of salicylaldehyde (manufactured by Kishida Chemical Co., Ltd.) diluted with a 10-fold amount of methanol to form a Schiff base, and further diluted with methanol after 1 hour to prepare a treatment liquid containing 0.5% of chitosan.

On the other hand, an alumina ceramic (99.9%) substrate (69 mm×29 mm×0.63 mm-t) was subjected twice to ultrasonic cleaning with distilled water for 5 minutes, further subjected to ultrasonic cleaning with methanol, and then dried to prepare a cleaned test piece.

The test piece was immersed in the abovementioned treatment liquid, and then dried at 120° C. for 30 minutes. Subsequently, the test piece was immersed in a 0.5% solution of dimethylaminoborane to reduce therewith the Schiff base, then immersed in a solution of palladium chloride ($PdCl_2 \cdot 2H_2O$: 0.03 g/l, hydrochloric acid: 5 ml/l) for 2 minutes, then washed with water, and dried. At this stage, the palladium adsorption was measured according to the following procedure. 100 ml of a 1% solution of nitric acid was added to the test piece, and heated to dissolve palladium, which thus fell off the test piece. The solution was further heated to effect evaporation, then placed in a 50 ml graduated measuring cylinder, into which distilled water was poured up to the marked line of the cylinder. The resulting solution was placed in a pyrolyzed graphite tube and combusted at a combustion temperature of 2,600° C. for 3 seconds while using an atomic-absorption spectroscopic analyzer (AA-670G, manufactured by Shimadzu Seisakusho Ltd.) and a graphite furnace atomizer (Model GFA-4) to measure the absorbance of palladium, from which the palladium adsorption was calculated. As a result, it was found out that the amount of palladium adsorbed on the catalyst metal-fixing carrier containing chitosan was 11.5 μg per test piece in This Example.

Subsequently, another test piece immersed in the treatment liquid and then in the solution of dimethylaminoborane in the same manner as described above, further immersed in the solution of palladium chloride for 2 minutes, then washed, and dried was subjected to electroless nickel plating in a plating bath having a composition as shown in Table 2 for 30 minutes to obtain a uniform nickel plating.

EXAMPLE 3

Chitosan (SK-100, Lot. 802-05; manufactured by San-Ei Chemical Industries, Ltd.) was dissolved in a 1% solution of acetic acid to prepare a 1 W/V % solution of chitosan. On the other hand, 20 parts of titanium oxide and 80 parts of aluminum silicate were mixed with and dispersed in 100 parts of an epoxy-curing type acrylic resin (manufactured by Toray Industries, Inc.) to prepare a solution, which was then diluted with a methanol/isopropyl alcohol/ethyl acetate/butyl cellosolve (80:12:3:5) mixed solvent to prepare a 20 W/V % solution. This solution was mixed with the abovementioned solution of chitosan at a ratio of 10:1 to prepare a pretreatment liquid containing chitosan as the active ingredient.

An ABS resin piece (50 mm×150 mm×2.0 mm-t) was prepared as a substrate, wiped with a cloth soaked with isopropyl alcohol to be degreased and cleaned, and then spray-coated with a solution prepared by adding 0.5 part of an epoxy curing agent (DENACOL EX-850 manufactured by Nagase Chemicals, Ltd.) to 100 parts of the abovementioned pretreatment liquid and diluting the resulting mixture with a 5-fold amount of a butyl acetate/ethyl acetate/n-butanol/toluene/butyl cellosolve (20:25:20:25:10) mixed solvent, followed by drying at 60° C. for 1 hour.

The coated ABS resin piece was immersed in a solution of palladium chloride ($PdCl_2 \cdot 2H_2O$: 0.25 g/l, hydrochloric acid: 5 ml/l) for 3 minutes, then washed with water, subsequently plated in an electroless copper plating bath having a composition as shown in Table 1 for 30 minutes, and then further plated in an electroless nickel plating bath having a composition as shown in Table 3 for 5 minutes to obtain a uniform copper/nickel plating having a thickness of 1.5 to 2.0 μm.

It was confirmed that the copper/nickel plating thus obtained exhibited a good appearance and an excellent adhesion in various property tests as shown in Table 4.

As for the adhesion, a 10 mm×10 mm area of the copper/nickel plating was cross-cut into 100 small squares each having a longitudinal length of 1 mm and a lateral length of 1 mm, and a cellophane adhesive tape was adhered to the cross-cut area of the plating and then peeled to evaluate the adhesion in terms of [number of remaining squares of plating/number of all squares].

TABLE 2

| Ingredient | Concentration |
| --- | --- |
| nickel sulfate | 20 g/l |
| sodium hypophosphite | 15 g/l |
| citric acid | 7 g/l |
| lactic acid | 5 g/l |
| glycine | 3 g/l |
| thiourea | 5 ppm |
| lead nitrate | 3 ppm | pH 9.0, liquid temperature: 83–87° C.

TABLE 3

| Ingredient | Concentration |
| --- | --- |
| nickel sulfate | 20 g/l |
| sodium hypophosphite | 15 g/l |
| citric acid | 5 g/l |
| sodium acetate | 3 g/l |
| glycine | 2 g/l |
| latic acid | 3 g/l |
| tiourea | 5 ppm |
| lead nitrate | 3 ppm | pH 6.0 Liquid Temperature: 55–60° C.

TABLE 4

TEST RESULTS

| Test | Test Method | Test Results Appearance | Secondary Adhesion |
|---|---|---|---|
| Adhesion Test | Cellophane adhesive tape test for 100 1-mm cross-cut squares | — | Primary adhesion 100/100 |
| Hardness Test | Pencil hardness test with Mitsu-Bishi Uni pencil | 2 H | — |
| Marring Test | Scratching with nail | Slight scratches | — |
| Moisture Resistance Test | 40° C. × 98% RH × 240 hr | Nothing unusual | 100/100 |
| Heat Resistance Test | 160° C. × 240 hr 270° C. × 96 hr | Nothing unusual | 100/100 |
| Low-Temperature Test | −20° C. × 96 hr | Nothing unusual | 100/100 |
| Thermal Shock Test | −20° C. × 1 hr 70° C. × 1 hr (4-cycles) | Nothing unusual | 98/100 |
| Alcohol Resistance Test | 80% aqueous solution of ethanol, 1 kgcm$^{-2}$ rubbing at 120 times/min(cotton cloth) | Nothing unusual | 100/100 |
| Detergent Resistance Test | 5% aqueous solution of My-pet, 40° C. × 95% RH × 240 hr., spot test | Slightly Discolored | 100/100 |
| Sweat Resistance Test | JIS L-0848 method A-1, using synthetic sweat, 40° C. × 95% RH × 240 hr., spot test | Slightly Discolored | 100/100 |
| Chemical Cleaner Resistance Test | Using high-grade wax cleaner J-240 manufactured by Eikosha k.k., 1.5 kgcm$^{-2}$, rubbing back and forth 50 times | Nothing unusual | 100/100 |
| Oil Resistance Test | Using machine oil, immersion at 20° C. for 8 hr. | Nothing unsual | 100/100 |
| Electrical Resistance | Using DIGITAL MULTIMETER TR-6853 manufactured by Takeda Riken k.k. | 0.0.2–0.03 mvΩ | — |

What is claimed is:

1. A process for catalyzation in electroless plating: comprising forming a coating film comprising chitosan or a chitosan derivative on the surface of a non-conductive substance, and subsequently treating said coating film with a solution of a salt of a catalyst metal to effect chemisorption thereof on said coating film.

2. A process for catalyzation in electroless plating as claimed in claim 1, wherein said coating film comprising chitosan or said chitosan derivative further comprises a resin.

3. A process for catalyzation in electroless plating as claimed in claim 2, wherein said coating film comprising chitosan or said chitosan derivative further comprises an inorganic pigment.

4. A process for catalyzation in electroless plating as claimed in claim 2, wherein said salt of said catalyst metal is a salt of a precious metal.

5. A process for catalyzation in electroless plating as claimed in claim 1, wherein said coating film comprising chitosan or said chitosan derivative further comprises an inorganic pigment.

6. A process for catalyzation in electroless plating as claimed in claim 5, wherein said salt of said catalyst metal is a salt of a precious metal.

7. A process for catalyzation in electroless plating as claimed in claim 1, wherein said salt of said catalyst metal is a salt of a precious metal.

* * * * *

Disclaimer

5,660,883—Yoshihiko Omura, Tottori, Japan. PROCESS FOR CATALYZATION IN ELECTROLESS PLATING. Patent dated August 26, 1997. Disclaimer filed July 24, 2002 by assignees, Omura Toryo co., Ltd. And Daishin Chemical Co., Ltd.

Hereby disclaims and dedicates to the public all claims (1-7) of said patent.
*(Official Gazette, September 10, 2002)*